United States Patent [19]

Carter et al.

[11] 4,379,270

[45] Apr. 5, 1983

[54] PHASE LOCKED LOOP HAVING RAPID TUNING

[75] Inventors: Margaret P. Carter, South Ruislip; David Hodgson, Oxford, both of England

[73] Assignee: British Communications Corporation, Ltd., Bracknell, England

[21] Appl. No.: 238,154

[22] Filed: Mar. 2, 1981

[30] Foreign Application Priority Data

Apr. 30, 1980 [GB] United Kingdom ................ 8014231

[51] Int. Cl.$^3$ .............................................. H03L 7/18
[52] U.S. Cl. .................................... 331/1 A; 331/16; 331/17; 331/25
[58] Field of Search .................... 331/1 A, 16, 17, 18, 331/25

[56] References Cited

U.S. PATENT DOCUMENTS

| | | | |
|---|---|---|---|
| 3,609,577 | 9/1971 | Bos ........................................ | 331/17 |
| 4,115,745 | 9/1978 | Egan .................................... | 331/17 |
| 4,219,783 | 8/1980 | Carter et al. ....................... | 331/1 A |
| 4,330,758 | 5/1982 | Swisher et al. ..................... | 331/1 A |

Primary Examiner—Siegfried H. Grimm
Attorney, Agent, or Firm—Leydig, Voit, Osann, Mayer & Holt, Ltd.

[57] ABSTRACT

A system is disclosed for very rapid tuning of a phase-locked loop. A fixed oscillator feeds a reference frequency to a phase comparator via a fixed divider, while a variable frequency oscillator (VCO) feeds its output frequency to the comparator via an adjustable divider. In response to a phase error, the comparator produces a control signal which is integrated in an integrator to adjust the VCO frequency. The value of the control signal is such that the VCO frequency is changed in a sense and by an amount which produces a temporary phase error in the opposite direction to the detected phase error. At such time, before the next phase comparison, as the temporary phase error has compensated for the detected phase error, a switch makes a set change in the integrator output so as to eliminate the temporary phase error and thereby to tend to equalise the control and reference frequencies at the end of that cycle.

8 Claims, 2 Drawing Figures

4,379,270

PHASE LOCKED LOOP HAVING RAPID TUNING

BACKGROUND OF THE INVENTION

The invention relates to electrical circuit arrangements. More specifically, the invention relates to frequency tuning circuit arrangements or systems for producing a desired frequency such as for use in a radio transmitter or receiver.

SUMMARY OF THE INVENTION

According to the invention, there is provided a frequency tuning arrangement for tuning a source of variable frequency to a desired frequency, comprising a source of reference frequency, frequency changing means connected to receive the frequency from one said source and to alter it by an adjustable factor so as to produce a control frequency, phase comparison means for repeatedly comparing the phases of the control frequency and the frequency from the other said source whereby to produce in response to each comparison a control signal dependent on the magnitude and direction of any phase error detected, adjusting means responsive to the control signal for adjusting the variable frequency source as to change the variable frequency in a sense and by an amount so as to produce a temporary phase error in the opposite direction to the detected phase error, the magnitude of the temporary phase error being substantially equal to the detected phase error, and control means operative to make such change in the control signal as causes a change in the variable frequency in the opposite sense and by such an amount and at such time before the next phase comparison as to eliminate the temporary phase error and to tend to equalise the control and reference frequencies.

According to the invention, there is also provided an automatic frequency tuning system, comprising a fixed frequency oscillator, a first frequency divider having a fixed division factor and connected to be fed by the fixed frequency oscillator to produce a reference frequency, a variable frequency oscillator, a second divider having a variable division factor and connected to be fed by the variable frequency oscillator so as to produce a variable control frequency, phase comparison means for repeatedly comparing the phases of the reference and control frequencies whereby to produce in response to each comparison a control signal dependent on the magnitude and direction of any phase error detected, integrated means connected to integrate the control signal, adjusting means responsive to the integrated control signal and connected to adjust the frequency of the variable frequency oscillator in dependence thereon, the integrating means integrating the control signal at such a rate that the adjusting means changes the variable frequency by an amount substantially twice as much as necessary to make the control frequency equal to the reference frequency so as to create a temporary phase error of opposite sign, and control means operative, in response to the temporary phase error having substantially compensated for the detected phase error before the next phase comparison, to make such substantially instantaneous reduction in the value of the integrated control signal as to cause the adjusting means to change the variable frequency in the opposite direction and by substantially half the said amount, whereby to tend to reduce the said phase error to zero. DR

DESCRIPTION OF THE DRAWINGS

An electrical frequency tuning system embodying the invention will now be described, by way of example only, with reference to the accompanying drawings in which.

DESCRIPTION OR PREFERRED EMBODIMENTS

Figure 1:
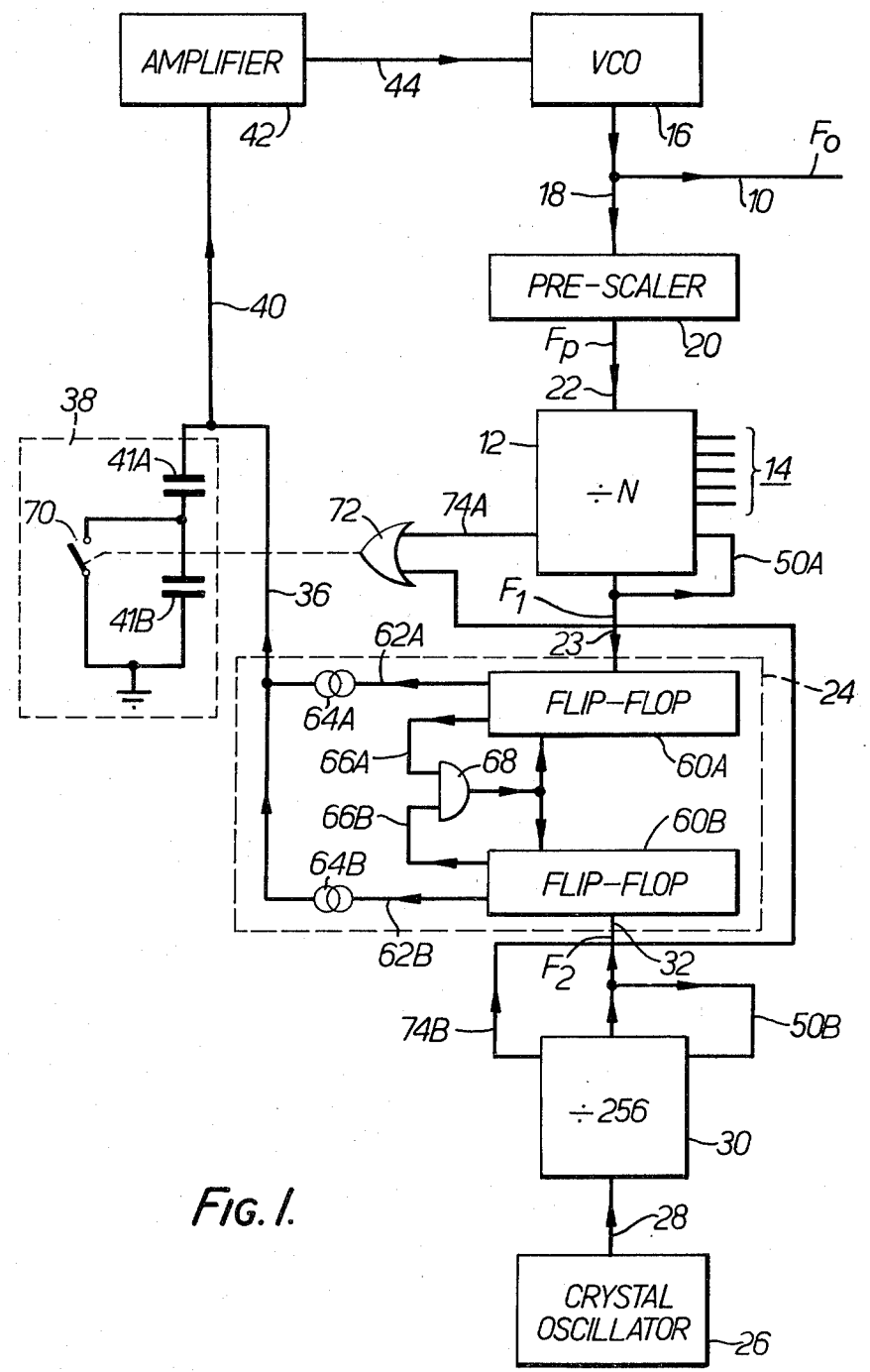
FIG. 1 is a circuit diagram, partly in block form and partly schematic, of the system.

The circuit arrangement shown in FIG. 1 is for use in tuning a radio receiver or transmitter (though is not restricted to such use). It produces an output frequency $F_o$ on a line 10 which is variable (in a manner to be described) under control of digital control information fed into a variable divider 12 on digital input lines 14. The digital information varies the division factor of N of the divider 12 and may come, for example, from a manually operable control which is used by the radio operator to tune the receiver or transmitter to a desired operating frequency. Instead, however, it may come from some other source. In a manner to be described in more detail below, the circuit arrangement is capable of changing the value of $F_o$ very rapidly (in dependence on changes in the digital information received on line 14), and in such a case the digital information fed to lines 14 may originate from a source operating to a predetermined program.

The circuit arrangement includes a voltage controlled oscillator (VCO) 16 which produces the output frequency $F_o$ on the line 10 and also feeds this frequency, by means of a line 18, to a pre-scaler divider 20. If the output frequency $F_o$ is in the range of, say, 30 MHz to about 100 MHz, then the division factor of the pre-scaler divider 20 is arranged to be such that its output frequency, $F_p$, on a line 22, lies in the range of 3 to 9 MHz. The frequency $F_p$ is fed on line 22 to the input of the divider 12. Pulses at the output frequency, $F_1$, of the divider 12 are fed by means of a line 23 to an input of a phase detector shown by the dotted line 24.

As shown, the circuit arrangement also comprises a temperature-controlled crystal oscillator 26 which oscillates at a fixed frequency $F_f$ which, by way of example only, is taken to be 6.4 MHz. The output frequency $F_f$ is fed on a line 28 to a fixed divider 30. If the fixed divider 30 is assumed, by way of example, to have a division factor of, say, 256, then the output pulses produced by the divider on a line 32 have a frequency $F_2$ of 25 kHZ and are fed into the phase detector 24.

In a manner to be explained in more detail below, if the output frequencies $F_1$ and $F_2$ from the dividers 12 and 30, respectively, are equal in phase and frequency, the phase detector 24 produces no output. However, if there is a phase difference, as will occur when the frequencies $F_1$ and $F_2$ differ, then the phase detector 24 will produce a succession of output pulses, on its output line 36, each representative of this difference. These output pulses will be applied, via a circuit 38 and a line 40, to an amplifier 42. The circuit 38 comprises capacitors 41A and 41B which integrate the pulses on line 36 and the amplified signal from amplifier 42 is applied by means of a line 44 to the control input of the oscillator 16 and adjusts its frequency accordingly. In a manner to be explained in detail, the system is arranged so that the output frequency of the oscillator 16 is brought towards phase equality with the frequency $F_2$, and when this situation is reached, the output on line 36 disappears. Therefore, the system operates by bringing $F_1$ into phase and frequency equality with $F_2$. Amplifier 42 may have a non-linear gain characteristic to compensate for the non-linear control signal/output frequency characteristic of the VCO 16.

When it is desired to set $F_o$ to a desired frequency, therefore, appropriate digital information is fed onto the control lines 14 so as to set the divider 12 to such value that, when its output frequency, $F_1$, is 25 KHz (which is the value to which, in the example being considered, it will be driven by the operation of the phase detector 24), the output frequency $F_o$ of the VCO will have the required value.

The divider 12 may take the form of a digital counter, for example a "down" counter. Under steady state conditions, a predetermined digital number (depending on the digital control information fed in on the control lines 14) is loaded into the counter at the beginning of each of its counting cycles, and the pulses at the frequency $F_p$ (on line 22) then cause the counter to count down from this predetermined number. When the count of counter 12 reaches zero, an output pulse $F_1$ is produced on the line 23, and at the same time a line 50A is energised and causes the predetermined number (depending on the digital information on the lines 14 at this instant) to be reloaded into the counter and the next counting cycle commences. The frequency, $F_1$, of the pulses on line 23 is therefore equal to the frequency $F_p$ divided by N where N is the number which is loaded into the counter at the beginning of each counting cycle.

The divider 30 is in similar form except that it is wired up so that the number re-loaded into it (by energisation of a line 50B) at the beginning of each counting cycle is fixed (at 256 in the example being considered).

As shown in FIG. 1, the phase detector 24 includes two flip-flop circuits 60A and 60B. The SET input of flip-flop 60A is connected to receive the pulses $F_1$ on the line 23. Similarly, the SET input of flip-flop 60B is connected to receive the pulses $F_2$ on the line 32 from the divider 30. When SET, flip-flop 60A produces an output on a line 62A which energises the current generator 64A to feed a predetermined value of current, at a predetermined polarity, onto line 36 connected to the circuit 38. Similarly, when flip-flop 60B is SET, it energises a current generator 64B via a line 62B, and this current generator produces a current of equal value and opposite polarity which is fed by means of a line 36 to the circuit 38.

Flip-flop 60A also has a second output, on a line 66A, which changes state with the change of state of line 62A, and is connected through a gate 68 to RESET inputs of both flip-flops. Flip-flop 60B has a corresponding output line 66B.

As indicated, the circuit 38 includes two capacitors 41A and 41B, having equal capacitance value C, which are connected in series between the line 40 and ground. However, capacitor 41B can be bypassed by a switch 70 (in practice, an electronic switch) which is operated by the output of a selection gate 72. Gate 72 has an input 74A which is energised by the counter 12 when the count of that counter reaches a predetermined low count, close to zero. The second input to gate 72 is fed from a line 74B which is energised when the count of counter 30 reaches a similar predetermined low value close to zero. Gate 72 operates in the manner of an OR gate in that it produces an output (to close switch 70) when either of its input lines 74A or 74B is energised, but during each counting cycle it only produces an output in response to the first one of these two lines to be energised. Its output holds the switch 70 closed for a short predetermined amount of time, and then releases it before the counter which energised it counts down to zero.

The operation of the arrangement as so far described will now be explained in conjunction with FIG. 2.

It will initially be assumed that the frequencies $F_1$ and $F_2$ are equal in phase, and FIGS. 2A and 2B respectively illustrate two consecutive pulses $F_1$ and the corresponding, in-phase, pulses $F_2$.

In response to the first pulse at the frequency $F_1$, flip-flop 60A is set and produces an output on line 62A as shown in FIG. 2C. Simultaneously, flip-flop 60B is SET by the first pulse of the frequency $F_2$ and produces an output on line 62B as shown by waveform 2D. However, each flip-flop is immediately RESET by the RESET outputs produced on lines 66A and 66B, as shown in waveforms 2H and 2I.

Only momentary pulses are therefore produced on lines 62A and 62B, and the current generators 64A and 64B are not effectively energised.

In response to the first pulse of the frequency $F_1$, a pulse will be produced on line 50A as shown in waveform 2J and, as explained, this pulse reloads the divider with the digital number existing at that time on the control lines 14 and the divider therefore immediately starts recounting. A similar operation occurs in respect of divider 30 as shown in waveforms 2K and this divider therefore immediately starts recounting.

Figure 2:
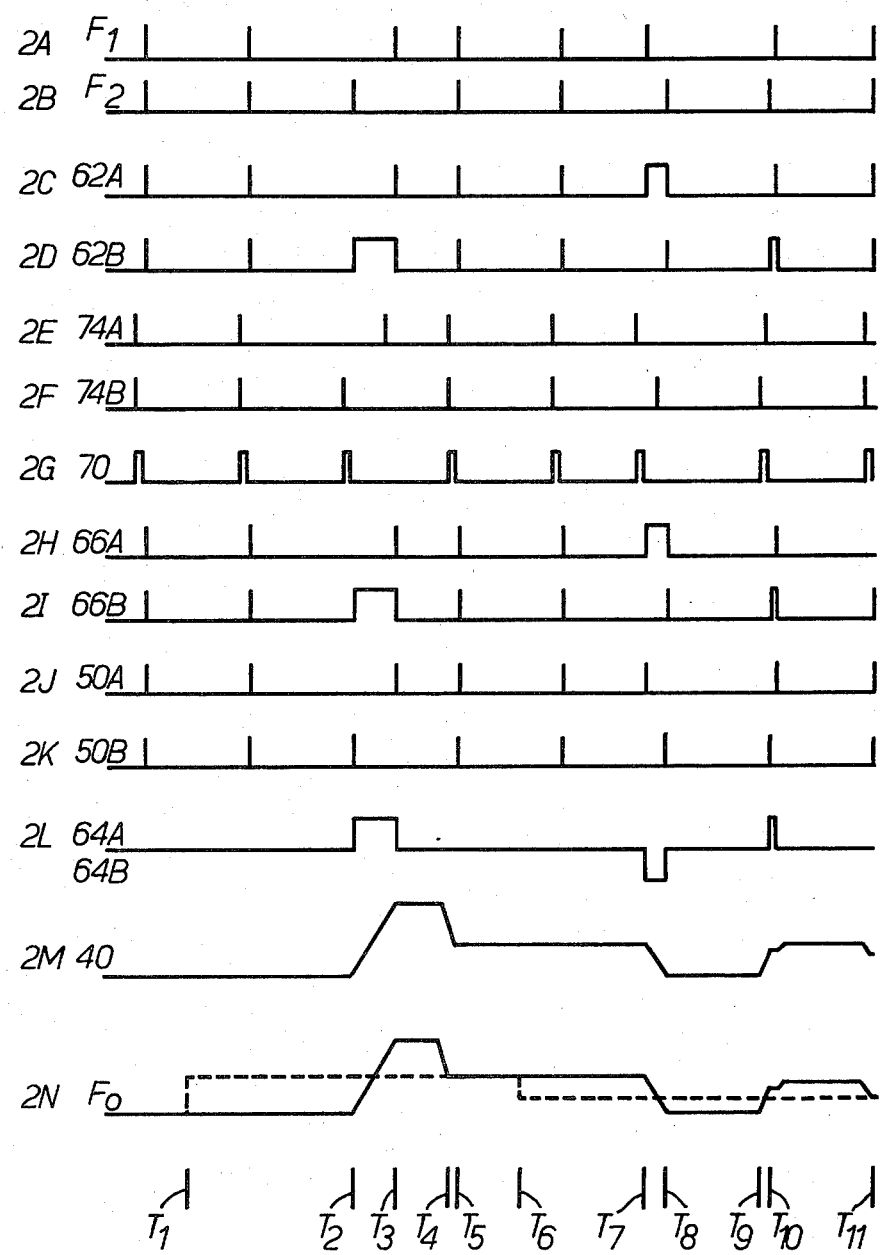
FIG. 2 shows waveforms occurring in the system.

The above described operation continues for so long as $F_1$ and $F_2$ are in phase and this situation is illustrated in FIG. 2 for the next following pulse of each of these frequencies.

During the above described process, pulses are produced on lines 74A (waveform 2E) and 74B (waveform 2F) and cause gate 72 to produce pulses shown in waveform 2G each of which holds switch 70 closed. However, this has no effect because the phase detector is producing no output on line 36.

It will now be assumed that a change in the desired value for the frequency $F_o$ is made—by altering the digital information fed to the control lines 14 of divider 12 (FIG. 1). It will be assumed that this change in desired frequency occurs at time $T_1$ (FIG. 2). This means that the new information (that is, the changed number represented by the digital signals on lines 14) will be loaded into the divider 12 by the signal on line 50A in response to the occurrence of the second pulse of the frequency $F_1$.

Up to this time, the frequencies $F_1$ and $F_2$ have each been 25 kHZ, and therefore the pulse period has been 40 $\mu$S. It will be assumed initially that the new desired value for $F_o$ is greater than the previous value. The new digital information on lines 14 will therefore have increased the division factor of the divider 12. Until the VCO 16 has altered its frequency, the effect will be to reduce $F_1$ and therefore increase its period. It will be assumed, by way of example, that the new digital information has the effect of increasing the period of frequency $F_1$ from 40 to 53 $\mu$S—as shown by the spacing between the second and third pulses of waveform 2A. Until the third pulse of frequency $F_1$ occurs, flip-flop 60A will not be SET.

However, frequency $F_2$ continues to be 25 kHz, and the third pulse of frequency $F_2$ will therefore occur 40

μS after the second pulse—as indicated at $T_2$ in FIG. 2B. At this instant, therefore, flip-flop 60B is SET as shown in waveform 2D. It remains SET, at least for the time being, because it receives no RESET pulse (because flip-flop 60A has not yet been SET). Therefore, it energises the current generator 64B which starts to produce a current output as shown in waveform 2L.

In addition, at time instant $T_2$ the line 50B (waveform 2K) of divider 30 will be energised to re-load the counter with its fixed count of 256 and the divider immediately restarts counting.

FIG. 2M shows the waveform of the output produced on line 40 (FIG. 1) by the circuit 38. At time $T_2$, switch 70 is open, and the current on line 36 (waveform 2L) is integrated by the two series-connected capacitors 41A and 41B.

FIG. 2N is a plot of the output frequency $F_o$ (which will of course be an analogue of the signal on line 40). As shown in waveform 2N, up to time instant $T_1$ the actual and desired values for $F_o$ are coincident. At time $T_1$, however, as previously explained, an increased value for $F_o$ is required and this is indicated by the dotted line in waveform 2N.

At time instant $T_2$, the integrated output on line 40 begins to adjust the actual value of the output frequency $F_o$ as shown by the solid line in FIG. 2N. The values of the capacitors 41A and 41B are selected such that the change in $F_o$ produced by the current pulse on line 36 (waveform 2L) is substantially twice that which is actually required. Therefore, as shown in waveform 2N, the frequency $F_o$ is increased to a value which exceeds the desired value by substantially the same amount as it was below the desired value immediately previously.

At 13 μS after time instant $T_2$, that is, at a time instant $T_3$, (FIG. 2), the next pulse of frequency $F_1$ occurs. This switches flip-flop 60A into the SET state as shown in waveform 2C when immediately both flip-flops 60A and 60B are RESET by the gate 78. Therefore, the current generator 64B is switched off (waveform 2L) and the output on line 40 (waveform 2M) is now held at a constant value—and therefore holds the frequency $F_o$ at a corresponding constant value (waveform 2N).

At the same time, line 50A is energised (FIG. 2J). Divider 12 therefore immediately becomes re-loaded with the count represented by the number of the digital input lines 14 and starts counting again.

Because the frequency of the oscillator 16 has now increased substantially, frequency $F_1$ (waveform 2A) will increase correspondingly. Assuming that the signal on line 40 has increased the oscillator frequency by exactly twice the amount required, the next pulse of frequency $F_1$ will occur at time $T_5$ in coincidence with the next pulse of frequency $F_2$. Immediately before this, however, that is, at time $T_4$, lines 74A and 74B will be energised—because the count of the counters 12 and 30 will have reached the predetermined count value close to zero, as shown in waveforms 2E and 2F. Therefore, gate 72 produces an output shown in waveform 2G which closes the switch 70. In fact, the counters 12 and 30 are not counting exactly in phase, and therefore one of the lines 74A and 74B may be energised before the other. However, in such a case only the first to be energised will cause the gate 72 to produce the output pulse of waveform 2G—and for ease of illustration it has been assumed in FIGS. 2A and 2F that lines 74A and 74B are energised simultaneously.

The effect of closure of switch 70 is to short-circuit capacitor 41B to ground and thus to halve the value of the signal on line 40 substantially instantaneously. As shown in waveforms 2M and 2N, the result of this is to bring the frequency $F_o$ of the oscillator 16 down to the correct value.

If the required change in frequency $F_o$ is in the opposite direction, then the operation of the system is similar to that described, except that it is flip-flop 60A which is held SET, so as to energise the current generator 64A instead of generator 64B. The operation is illustrated in FIG. 2, where it is assumed that the change (reduction) in frequency $F_o$ is input at time instant $T_6$ (that is, this is the time instant at which the operator feeds in the changed digital information from the lines 14). Time instants $T_7$, $T_8$, $T_9$ and $T_{10}$ correspond respectively to time instants $T_2$, $T_3$, $T_4$ and $T_5$. As shown, the output on line 40 is now in the opposite direction, and results in a reduction of the frequency of the VCO 16. Again, the reduction in frequency which is produced by the integrated output on line 40 is such as to change the frequency $F_o$ by twice the required value and is then brought back to the required value by closure of the switch 70 (waveform 2G) at time $T_9$.

For the increase in output frequency $F_o$ which was called for at time $T_1$, it was assumed that the resultant change in frequency produced by the integrated output on line 40 was exactly that amount necessary to produce a frequency change of twice the required value, and that the subsequent closure of the switch 70 at time $T_4$ was such as exactly to halve the frequency increase, thereby bringing the frequency $F_o$ exactly to the required value of time $T_5$. In practice, such exactly required frequency changes may not occur, and waveform 2N shows how the frequency change brought about by closure of the switch 70 at time $T_9$ *is such that the frequency $F_o$ is slightly above the required value*. This means, therefore, that the frequency $F_1$ will be slightly above the frequency $F_2$. Therefore, the flip-flop 60A will again energise current generator 64A to produce an integrated output on line 40. The process already described therefore repeats as shown during the next pulses of $F_1$ and $F_2$. It is assumed that the frequency $F_o$ reaches the correct value at time instant $T_{11}$. In practice, of course, there might still be a residual error and, if so, the operation already described would take place again until this error was reduced to zero.

The system therefore operates, in response to a change in demanded output frequency by causing a frequency change which is temporarily double the required amount. This doubled change in frequency enables the necessary adjustment in both frequency and phase to be produced so that, when the frequency change is subsequently halved (towards the end of the next counting cycle) the necessary adjustment to both frequency and phase has been made. This contrasts with previous systems in which a frequency error causes a phase detector output sufficient merely to compensate for the frequency error. In such previous systems, although the effect of the first detected phase difference will be to bring the frequency from the variable divider back to equality with the frequency from the fixed divider, there will still be a phase difference—because of the inequality of the lengths of the periods of the two frequencies which occurred in response to the initial change in frequency. Therefore, the phase detector will cause a further change in frequency of the output from the variable divider and this will tend to bring the two frequencies into instantaneous phase equality but to unequalise their frequencies. Therefore, after the next period, their phases will be once more unequal and the phase detector will cause a further change in frequency from the variable divider, this time in the opposite direction. It can be shown that the effect of this is to cause the frequency from the variable divider to oscillate about the desired value at one sixth of the frequency from the fixed divider. In such previous systems, therefore, it has been customary to modify the loop filter so as to include a damping circuit tuned to damp out this oscillation. Because the system disclosed herein brings the oscillator to the new frequency without using such a damping circuit, it can do so very much more rapidly than such previous systems.

Various modifications can be made to the system disclosed.

For example, instead of arranging for the integrator 38 to be such as to produce a frequency change of double the required amount, it could be arranged to produce a frequency change greater than the required change by some other amount, for example more than double. In such a case, therefore, the outputs on lines 74A and 74B would be arranged to be produced earlier during the counting cycle, so as to close the switch 70 at an earlier time. The values of the capacitors 41A and 41B would also be adjusted so that the result would be that closure of switch 70 would bring the oscillator frequency back to the eventually required value. The point in the counting cycle at which this would be designed to occur would be such that the temporary phase error produced by the frequency overswing would be substantially equalised to the previously detected phase error. However, there are practical limits to the amounts by which the frequency of the oscillator can be increased.

What is claimed is:

1. A frequency tuning arrangement for tuning a variable frequency to a desired frequency, comprising
   a source of the variable frequency,
   a source of reference frequency,
   frequency changing means connected to receive the frequency from one said source and to alter it by an adjustable factor so as to produce a control frequency,
   phase comparison means for repeatedly comparing the phases of the control frequency and the frequency from the other said source whereby to produce in response to each comparison a control signal dependent on the magnitude and direction of any phase error detected,
   adjusting means responsive to the control signal and connected to adjust the variable frequency source so as to change the variable frequency in a sense and by an amount so as to produce a temporary phase error in the opposite direction to the detected phase error, the magnitude of the temporary phase error being substantially equal to the detected phase error, and
   control means operative to make such change in the control signal as causes a change in the variable frequency in the opposite sense and by such an amount and at such time before the next phase comparison as to eliminate the temporary phase error and to tend to equalize the control frequency and the frequency from the other said source.

2. An arrangement according to claim 1, in which the frequency changing means is a frequency divider, and the said factor is its division factor.

3. An arrangement according to claim 1 or 2, in which the reference frequency source comprises a reference oscillator feeding a frequency divider having a fixed division factor so as to produce the said reference frequency, and in which the frequency changing means is connected to receive the said variable frequency.

4. An arrangement according to claim 1, in which
   the phase comparison means comprises means for producing as each control signal a current pulse having a predetermined amplitude and having a duration and sign respectively dependent on the magnitude of any phase error detected,
   the adjusting means comprises integrating means switchable between a first state, in which it integrates the current pulse at such a rate as to produce an output which changes the variable frequency in the sense and by an amount necessary to produce the said temporary phase error, and a second state, in which it makes a substantially instantaneous alteration in the value at the output in the opposite sense and by such an amount as to change the variable frequency to tend to substantially equalize the control frequency and the frequency from the other said source, and
   the control means comprises means for switching the integrating means from the first state to the second state at the said time before the next phase comparison.

5. An arrangement according to claim 4, in which the integrating means comprises
   two capacitors connected in series to integrate the said current pulses, and
   switch means connected in parallel with one said capacitor so as to switch the integrating means into the said second state when closed.

6. An arrangement according to claim 5, in which the capacitors have substantially equal capacitance value which is such that, when the integrating means is in the first state, the output produced by the integrating means changes the variable frequency by twice the amount necessary to equalize the control frequency and the frequency from the other said soruce, and so that closure of the switch means reduces the output of the integrating means to half its previous value.

7. An automatic frequency tuning system, comprising
   a fixed frequency oscillator,
   a first frequency divider having a fixed division factor and connected to be fed by the fixed frequency oscillator to produce a reference frequency,
   a variable frequency oscillator,
   a second divider having a variable division factor and connected to be fed by the variable frequency oscillator so as to produce a variable control frequency,
   phase comparison means repeatedly comparing the phases of the reference and control frequencies whereby to produce in response to each comparison a control signal dependent on the magnitude and direction of any phase error detected,
   integrating means connected to integrate the control signal,
   adjusting means responsive to the integrated control signal and connected to adjust the frequency of the variable frequency oscillator in dependence thereon,
   the integrating means integrating the control signal at such a rate that the adjusting means changes the variable frequency by an amount substantially twice as much as necessary to make the control frequency equal to the reference frequency so as to create a temporary phase error of opposite sign, and control means operative, in response to the temporary phase error having substantially compensated for the detected phase error before the next phase comparison, to make such substantially instantaneous reduction in the value of the integrated control signal as to cause the adjusting means to change the variable frequency in the opposite direction and by substantially half the said amount, whereby to tend to reduce the said phase error to zero.

8. A system according to claim 7, in which the integrating means comprises two capacitors connected in series to integrate the said control signal, and switch means connected in parallel with one said capacitor and connected to be operated by the said control means so as to make the said reduction in the output of the integrating means.

* * * * *